United States Patent
Klecka et al.

[11] Patent Number: 5,996,399
[45] Date of Patent: *Dec. 7, 1999

[54] METHOD OF USING A TEST LIQUID FOR CHECKING THE EFFICIENCY OF ELECTRICAL POWER STATION COMPONENTS

[75] Inventors: Frantisek Klecka, Alzenau; Christian Leder, Forchheim; Rainer Wulff, Nürnberg; Lüder Warnken, Erlangen, all of Germany

[73] Assignee: Siemens Aktiengesellschaft, Munich, Germany

[*] Notice: This patent is subject to a terminal disclaimer.

[21] Appl. No.: 08/730,341

[22] Filed: Oct. 15, 1996

Related U.S. Application Data

[63] Continuation of application No. PCT/DE95/00497, Apr. 11, 1995.

[30] Foreign Application Priority Data

Apr. 15, 1994 [DE] Germany ............ 44 13 210

[51] Int. Cl.$^6$ ............ G01M 3/64; G01R 31/12
[52] U.S. Cl. ............ 73/40.5 R; 73/40.7; 324/551; 252/408.1
[58] Field of Search ............ 252/351, 408.1; 324/551, 557, 559; 516/204, 920; 73/40.5 R, 40.7

[56] References Cited

U.S. PATENT DOCUMENTS

| | | | |
|---|---|---|---|
| 3,810,007 | 5/1974 | Wiseman et al. | 324/557 |
| 3,821,640 | 6/1974 | Bahder et al. | 324/544 |
| 3,957,425 | 5/1976 | Tullio | 8/681 |
| 4,001,128 | 1/1977 | Penneck | 524/263 |
| 4,302,349 | 11/1981 | Kosswig et al. | 510/413 |
| 4,314,308 | 2/1982 | Faulkner | 361/212 |
| 4,527,421 | 7/1985 | Miller, Jr. | 73/64.4 |
| 4,883,839 | 11/1989 | Fitzgerald et al. | 8/8.62 |
| 4,955,726 | 9/1990 | Bargigia et al. | 374/57 |
| 5,174,913 | 12/1992 | Alford et al. | 507/240 |
| 5,773,982 | 6/1998 | Wolf et al. | 324/551 |

FOREIGN PATENT DOCUMENTS

| | | |
|---|---|---|
| 2 225 819 | 11/1974 | France . |
| 27 01 287 | 7/1977 | Germany . |
| 29 25 628 | 1/1981 | Germany . |
| 42 27 436 A1 | 3/1993 | Germany . |
| 1 570 911 | 7/1980 | United Kingdom . |

OTHER PUBLICATIONS

Hawley's Condensed Chmical Dictionary, Eleventh Edition, (Van Nostrand Reinhold Co., NY, NY, copyright 1987) p. 1235, Oct. 1989.

"Theoretical foundations", Hütte des Ingenieurs Taschenbuch, 28th edition, Berlin 1955, Month unknown, pp. 1233–1234.

"Introduction to theoretical electro–technology", Küpfmüller, 7th improved edition, Berlin, 1962, Month unknown, pp. 9–10.

"Automatic insulator–washing system to prevent flashover due to pollution", Proceed, IEE, vol. 125, No. 12, Dec. 1978, pp. 1363–1366.

*Primary Examiner*—Richard D. Lovering
*Assistant Examiner*—Daniel S. Metzmaier
*Attorney, Agent, or Firm*—Herbert L. Lerner; Laurence A. Greenberg

[57] ABSTRACT

The invention teaches a method for using a test liquid to simulate the effects of a coolant condensate on an electrical power station component in the event of an accident with an uncontrolled escape of coolant condensate, in which a film is formed on a surface of the power station component and then a resistance test of the power station component is performed. A test liquid formed of polyglycol ether which has a content of between 0.01 and 0.5 weight % dissolved in deionized water, a conductivity between 1 and 6 $\mu$S/cm at room temperature, and a surface tension up to 50 mN/m at room temperature is provided. A power station component is coated with a film of the test liquid. A resistance check of the coated power station component is then performed.

5 Claims, 4 Drawing Sheets

METHOD OF USING A TEST LIQUID FOR CHECKING THE EFFICIENCY OF ELECTRICAL POWER STATION COMPONENTS

CROSS-REFERENCE TO RELATED APPLICATION

This application is a Continuation of International Application Serial No. PCT/DE95/00497, filed Apr. 11, 1995.

BACKGROUND OF THE INVENTION

1. Field of the Invention

The invention relates to a test liquid used to simulate the effects of a coolant condensate on an electrical power station component in the event of an accident involving an escape of coolant condensate.

It is known from Published French Patent Application 2,225,819, corresponding to U.S. Pat. No. 3,821,640, to use a test liquid to wet an insulated cable in order to check its insulation.

In the case of a coolant loss accident (CL accident), major amounts of steam are generally produced. The condensate that then occurs wets numerous components, including the energy generation and distribution and control systems. That creates a moist film, which becomes conductive from contaminants on the component surface. If one of those components is impaired in its function or destroyed by the condensate that wets it, for instance because its cables, distributors and leadthroughs are poorly insulated, the result can be that the provisions necessary to control the accident are made more difficult. Moreover, not only the coolant system but also the components damaged by the condensate will then have to be repaired.

In order to avoid such damage, all of the components of a power station that could become wetted with condensate in the event of a CL accident are built in such a way that they are not impaired in their function by being wetted under accident conditions, for instance by being encapsulated, potted, or equipped with long creep paths (so-called coolant loss resistance).

Since as a rule insulation materials age, and thus the coolant loss resistance can drop over the service life of a component from external factors and even the operation of the component itself, the coolant loss resistance of affected components should be checked regularly by suitable processes. One such process is disclosed in the commonly assigned U.S. Pat. No. 5,773,982 entitled: "Process for Checking the Efficiency of an Electric Power Station Component.", which was filed simultaneously with the instant application.

In particular, that process enables such testing without having to remove the component. Thus connections or distributors, for instance, can be tested in the operationally ready state without destruction or dismantling and the test can even be performed during ongoing operation. the test process in accordance with the commonly assigned U.S. Pat. No. 5,773,982 entitled: "Process for Checking the Efficiency of an Electric Power Station Component.", which was filed simultaneously with the instant application, provides for simulation of the wetting by condensate in the case of the coolant loss accident by applying a test liquid of defined conductivity that provides good wetting, in order to then measure the insulation resistance as a value for the functioning of the component. The surface is subsequently dried again. The surface may preferably be rinsed before drying with a residue-free, removable rinsing medium.

If a crack occurs in the coolant system, especially for instance, in a nuclear reactor cooled with light water, then because of the high pressure at the elevated operating temperature, the water escapes into other parts of the power station in which electrical components are located. This water condenses on the various components, and while it largely drops off them (especially when their surface is very clean), nevertheless if dust has deposited on them after relatively long periods of operation, it mixes with that dirt. The result is that on the magnet drives for the control rods, the open-loop and closed-loop control devices and signal systems, a moist film of dirt at approximately 160° C. forms, which can cause short circuits in the power supply, incorrect signals or missing signals and other defects that impair the function of those devices. The vulnerability to malfunction is further increased by the pressure of the coolant vapor.

The process detects the danger of such functional disturbances in good time to enable taking suitable countermeasures (such as replacing the threatened components).

SUMMARY OF THE INVENTION

It is accordingly an object of the invention to provide a test liquid for simulating the effects of a coolant condensate on an electrical power station component, which overcomes the hereinafore-mentioned disadvantages of the heretofore-known products of this general type and which is suitable for such tests.

The invention contemplates a test liquid that makes it possible to simulate the effects of the coolant condensate with respect to surface tension and conductivity. That is, the conductivity and surface tension of the test liquid, at the temperature of the measurements, are advantageously approximately the same as the conductivity and surface tension of the incident condensate in the accident.

In the case of the coolant loss accident, complete wetting of the components by incident condensate is suspected. Saturated steam conditions prevail at 160° C. A factor of interest for the substituted testing that is sought is the "wetting power" of the condensate under those conditions, or in other words the degree of capability of wetting the surface of an insulator and therefore of forming a closed or uninterrupted film (definition in accordance with DIN 53900).

With the foregoing and other objects in view there is provided, in accordance with the invention, a test liquid for simulating the effects of a coolant condensate on an electrical power station component in the event of an accident with an uncontrolled escape of coolant condensate, in which a film is formed on a surface of the power station component, the test liquid comprising a conductivity between 1 and 6 $\mu$S/cm at room temperature; a surface tension up to 50 mN/m at room temperature; and an ability to be practically inert with respect to a material forming a power station component on which a film is formed and an ability to be easily removable from a surface of the power station component.

In accordance with another feature of the invention, the surface tension is adjusted by diluting a nonionic wetting agent with deionized water.

In accordance with a further feature of the invention, the surface tension is constant between 15 and 35° C.

In accordance with an added feature of the invention, there is provided a polyglycol ether having a content of between 0.01 and 0.5 weight %, dissolved in deionized water.

In accordance with an additional feature of the invention, the polyglycol ether has a content of 0.1±0.05 weight % and a general formula R—CH$_2$—O(CH$_2$CH$_2$O)$_n$H, in which R is a radical of a fatty alcohol with a mean chain length of 13 carbon atoms, and n is between 5 and approximately 15, at 20° C.

In accordance with yet another feature of the invention, n has a mean value of 8.

In accordance with a concomitant feature of the invention, there is provided an undiluted wetting agent with a viscosity of between 60 and 100 mPas at 20° C.

Other features which are considered as characteristic for the invention are set forth in the appended claims.

Although the invention is illustrated and described herein as embodied in a test liquid for simulating the effects of a coolant condensate on an electrical power station component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
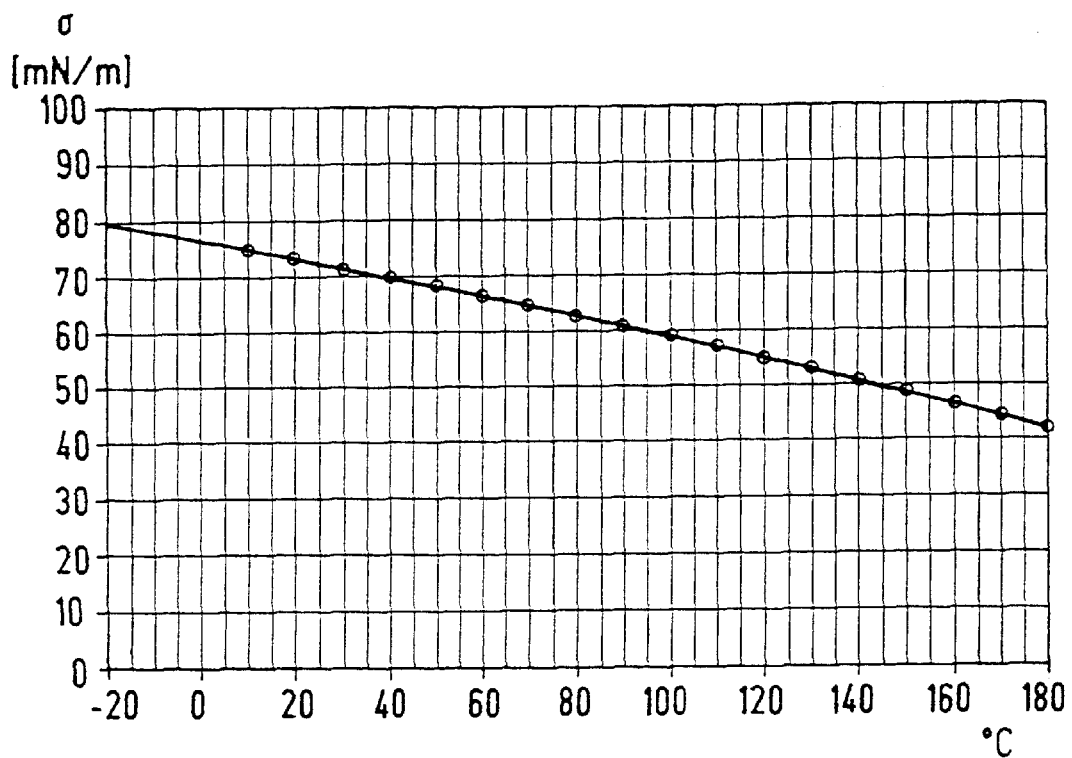
FIG. 1 is a diagram showing a surface tension of deionized water in air as a function of temperature.

Referring now to the figures of the drawings in detail and first, particularly, to FIG. 1 thereof, there is seen a diagram showing surface tension of deionized water in air as a function of temperature, in which a wetting tendency of a liquid becomes greater as the surface tension "sigma" becomes lower. It can be seen that as the temperature rises, the surface tension drops markedly, so that in a coolant loss accident at 160° C. (surface tension of the deionized water of 47 mN/m), better wetting of the surface by the incident condensate occurs than at room temperature.

Figure 2:
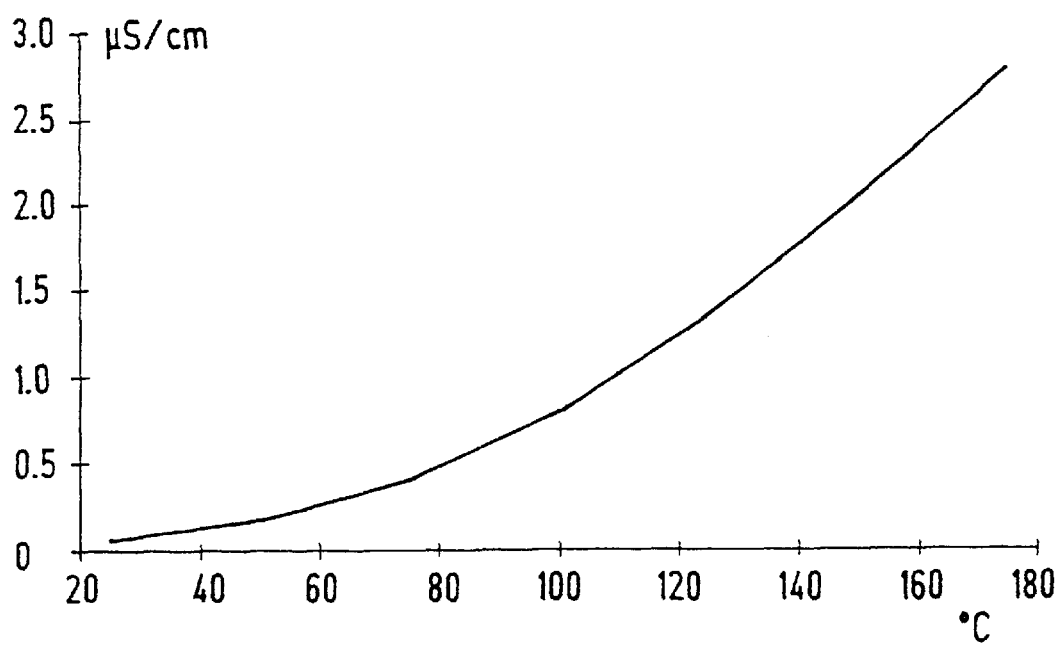
FIG. 2 is a diagram showing a conductivity of pure deionized water as a function of the temperature.

Another influencing variable is the electrical conductivity of the condensate. In FIG. 2, the conductivity of pure deionized water is shown as a function of the temperature (approximately 2 $\mu$S/cm at 160° C.). As a rule, the coolant of a nuclear power station is of high purity, but a certain quantity of boron solution is added for other reasons. At the least favorable assumption that the coolant loss accident occurs at a maximum boron concentration of 2200 ppm in the coolant, a slight proportion of boron, which produces a boron concentration of 20 ppm (in the form of boric acid) in the condensate, is entrained through the steam path of the coolant. This proportion causes a slight conductivity of 0.3 $\mu$S/cm at 25° C. and can be considered insignificant, especially since the amount of conductivity only slightly affects the insulation resistance measurement.

A suitable test liquid according to the invention is maximally compatible with the materials used in the power station, it has a conductivity at room temperature of between 1 and 6 $\mu$S/cm, it has a surface tension at room temperature of up to 50 mN/m and the liquid is easily removable from the surface. In particular, with the invention, a test liquid can be produced having a surface tension and conductivity at normal pressure and in the range of normal room temperatures which are on the same order of magnitude as for deionized water at 160° C. Moreover, there are no effects on the properties or service life of the test specimen from the use of the liquid. In addition, the test liquid can be handled without problems and is safe to use from a health standpoint.

An advantageous test liquid is adjusted by diluting a nonionic wetting agent with deionized water. This matches the fact that the coolant system of nuclear reactors contains highly pure (deionized) water, to which only a slight quantity of boron is added. It also has the advantage of assuring that the test liquid can be easily produced at any power station by dilution of a concentrate, which can be kept on hand there.

Advantageously, the surface tension of the test liquid in the temperature range from 15° C. to 35° C., or in other words in the range of normal room temperature, is temperature-independent, so that testing does not require separate tempering of the power station.

Since the surface tension of the condensate is approximately 47 mN/m and the conductivity is approximately 2.5 $\mu$S/cm, an advantageous test liquid has a surface tension of about 25 to 50 mN/m and a conductivity of about 1 to 6 $\mu$S/cm, and as a result the test liquid simulates the influences of the condensate in a comparable way. The low surface tension moreover produces complete, replicable wetting of the component surfaces.

Advantageously, polyglycol ethers are used as wetting agents for the largely deionized water. As nonionic surfactants, they only slightly affect the conductivity, when present in a proportion from 0.01 to 0.5 weight %, and thus have the aforementioned desired advantages. A content of 0.1±0.05 weight % of a polyglycol ether of the general formula R—CH$_2$—O(CH$_2$CH$_2$O)$_n$H, in which R is a radical of a fatty alcohol with a mean chain length of 13 carbon atoms, and n is between 5 and approximately 15 proves to be especially suitable. The wetting action increases with increasing ethylene oxide, it attains an optimal value at n=8, and drops slightly again as the value of n rises further. Accordingly, R—CH$_2$—O(CH$_2$CH$_2$O)$_8$H is used as an especially advantageous wetting agent. It has an especially pronounced wetting capacity and moreover is highly water-soluble especially in the low temperature range.

Figure 3:
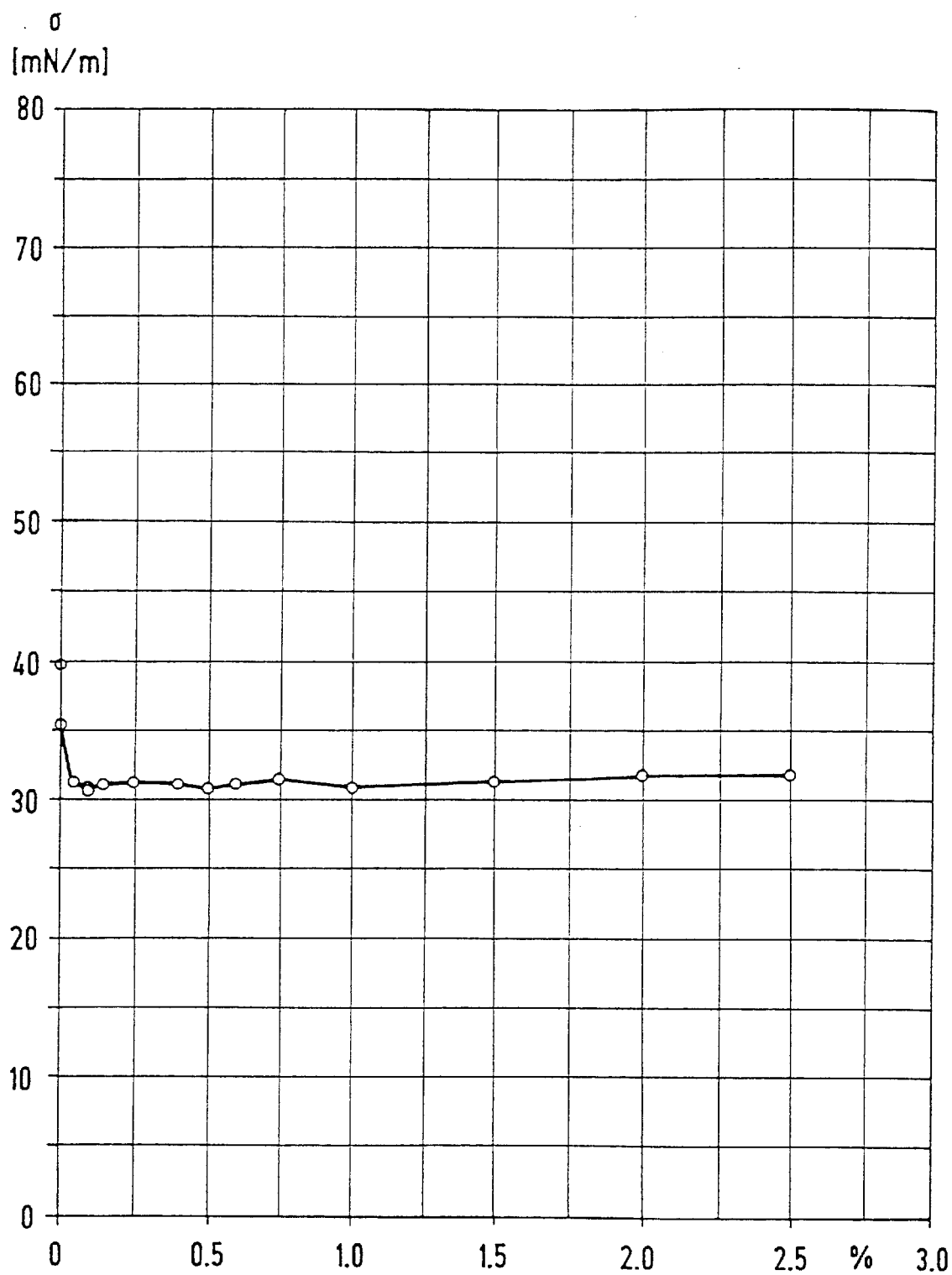
FIG. 3 is a diagram showing the surface tension of deionized water with various admixtures of a wetting agent.
Figure 4:
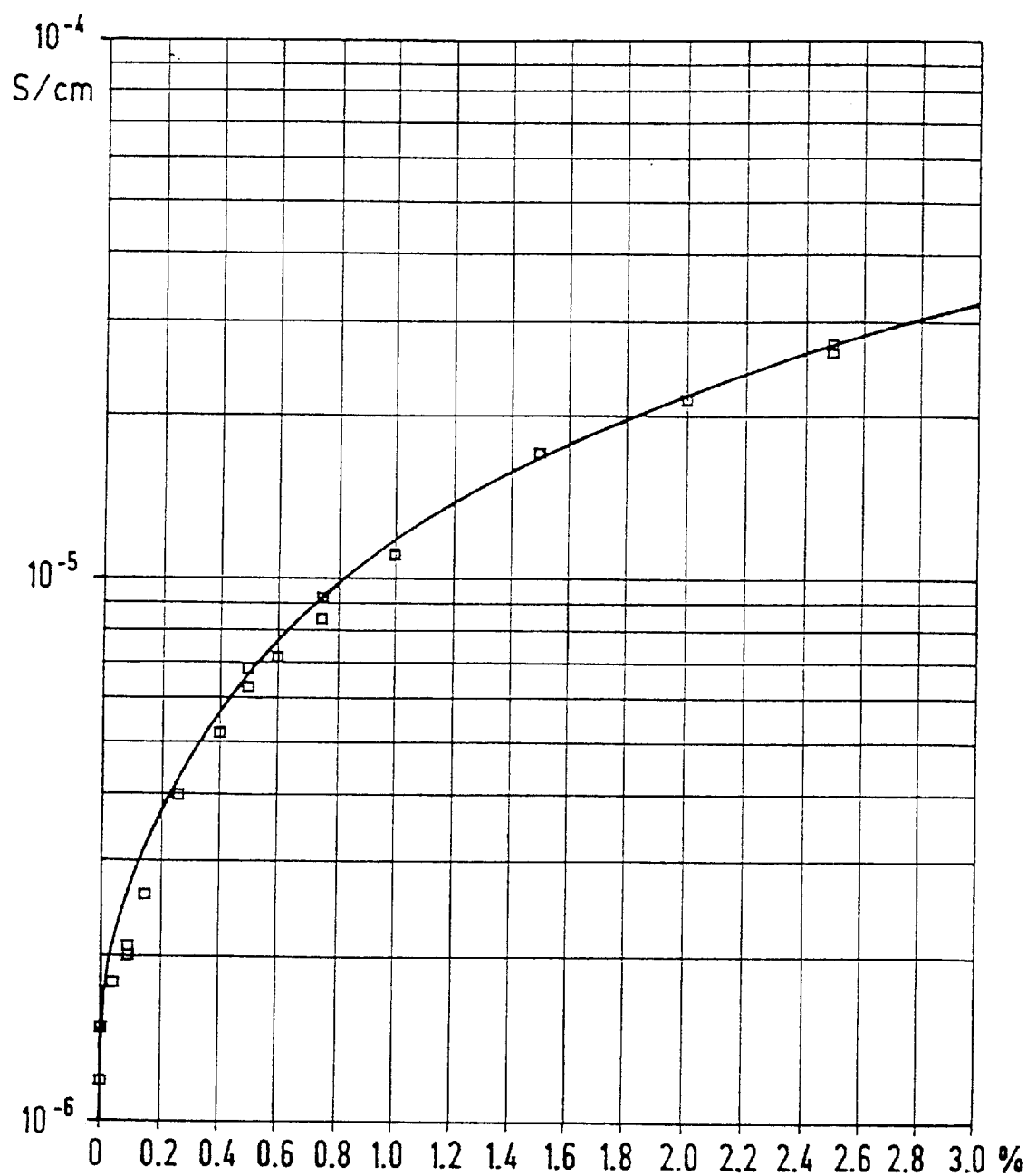
FIG. 4 is a diagram showing an admixture of the wetting agent producing a conductivity.

FIG. 3 shows the surface tension of deionized water with various admixtures of this wetting agent. The two measured values, which are shown for a proportion by weight of 0% of the wetting agent, correspond to a dilution of 1 or 2 drops in 1000 g of deionized water. As can already be seen from a wetting agent admixture of 0.05 weight % onward, a surface tension value of approximately 31 mN/m ensues, which does not drop further even with a greater admixture. The surface tension of the condensate (deionized water) in the coolant loss accident at 160° C. is approximately 47 mN/m (see FIG. 1). The wetting capacity of the test medium is thus on the order of magnitude of the condensate that is deposited in the coolant loss accident. The same is true of the parameter of electrical conductivity. As FIG. 4 shows, an admixture of 0.1 weight % of the wetting agent produces a conductivity of about 2 $\mu$S/cm. Once again, the same order of magnitude is thus present as for deionized water at 160° C. (see FIG. 2).

Figure 5:
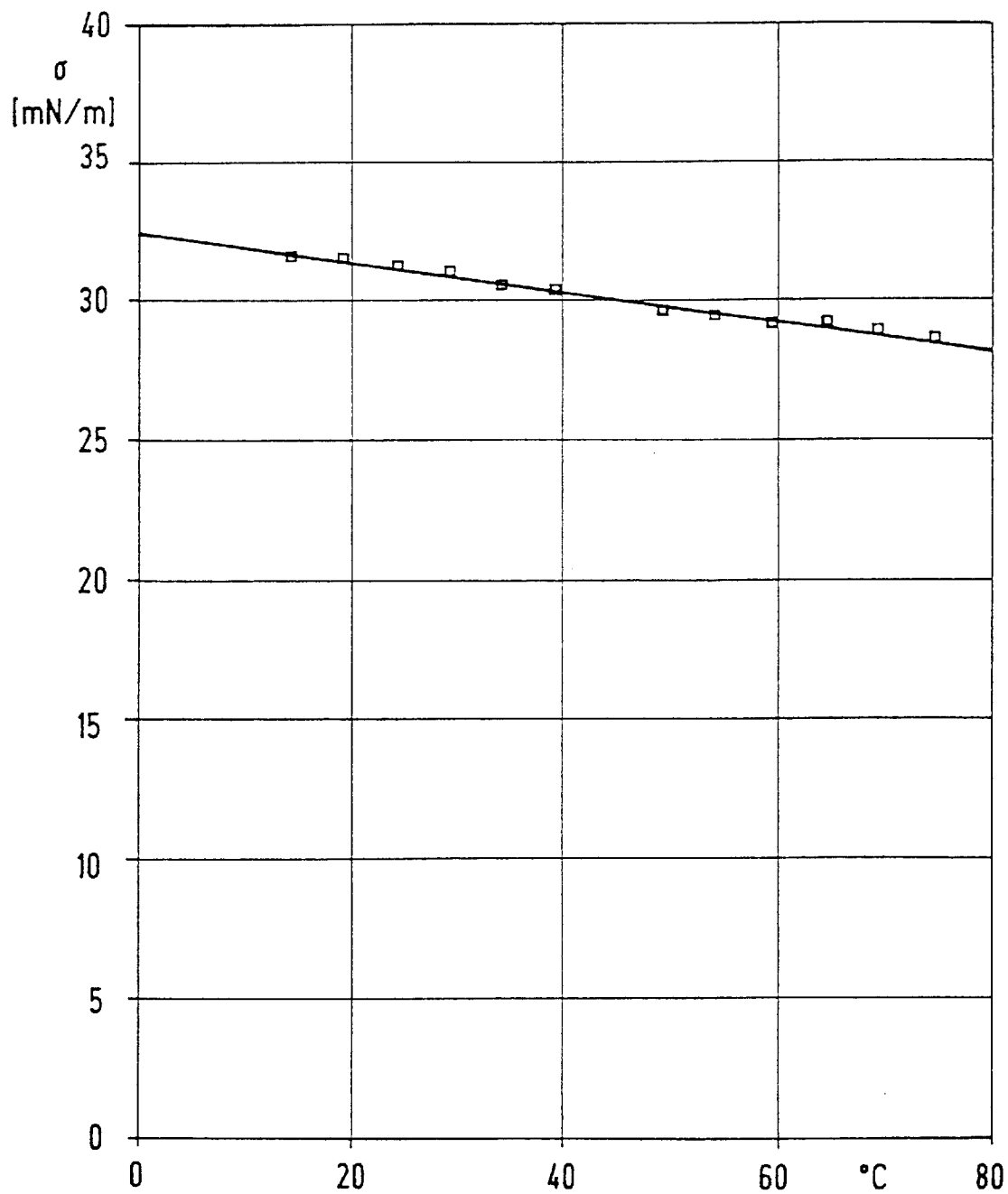
FIG. 5 is a diagram showing the surface tension of the test medium which only slightly varies.

As FIG. 5 shows, the surface tension of this test medium varies only slightly between 15° C. and 35° C. The solid-line curve shows an exponential function, from which the applicable value can be extrapolated for higher temperatures as well.

FIG. 3 also shows that for the wetting agent concentration at 0.1 weight %, wide tolerance limits are entirely possible, without impairing the replicability of the surface tension. Therefore, a wetting agent concentration of 0.1±0.05 weight % can be allowed.

A standard test liquid that meets the aforementioned requirements entirely can thus be produced at any power station by diluting this wetting agent. Possible residues of wetting agent or test liquid can easily be removed by ensuing rinsing with deionized water.

We claim:

1. A method for using a test liquid for simulating the effects of a coolant condensate on an electrical power station component in the event of an accident with an uncontrolled escape of coolant condensate, in which a film is formed on a surface of the power station component and for testing a resistance of the power station component, which comprises:

providing a test liquid formed of polyglycol ether having a content of between 0.01 and 0.5 weight % dissolved in deionized water, a conductivity between 1 and 6 $\mu$S/cm at room temperature, and a surface tension up to 50 mN/m at room temperature;

coating a power station component with a film of the test liquid; and checking a resistance of the coated power station component.

2. The method according to claim 1, which comprises providing the test liquid with a constant surface tension between 15 and 35° C.

3. The method according to claim 1, which comprises providing the test liquid with the polyglycol ether formula R—$CH_2$—O($CH_2CH_2$)$_n$H, in which R is a radical of a fatty alcohol with a mean chain length of 13 carbon atoms, and n is between 5 and approximately 15, at 20° C.

4. The method according to claim 3, which comprises providing the test liquid in which n has a mean value of 8.

5. The method according to claim 1, which comprises providing the test liquid in an undiluted form with a viscosity of between 60 and 100 mPas at 20° C.

* * * * *